(12) United States Patent
Hwang

(10) Patent No.: US 8,945,949 B2
(45) Date of Patent: Feb. 3, 2015

(54) METHOD FOR FABRICATING VARIABLE RESISTANCE MEMORY DEVICE

(75) Inventor: Sang Min Hwang, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 332 days.

(21) Appl. No.: 13/595,567

(22) Filed: Aug. 27, 2012

(65) Prior Publication Data
US 2013/0171741 A1 Jul. 4, 2013

(30) Foreign Application Priority Data

Dec. 28, 2011 (KR) .................. 10-2011-0145040

(51) Int. Cl.
*H01L 21/00* (2006.01)
*H01L 21/20* (2006.01)

(52) U.S. Cl.
USPC .......... 438/3; 438/73; 438/382; 257/E21.004; 257/E21.645; 257/E21.665

(58) Field of Classification Search
None
See application file for complete search history.

(56) References Cited

U.S. PATENT DOCUMENTS

| 2005/0232006 | A1* | 10/2005 | Iwata | 365/171 |
| 2010/0224920 | A1* | 9/2010 | Lee | 257/295 |
| 2013/0043530 | A1* | 2/2013 | Kim et al. | 257/334 |

* cited by examiner

*Primary Examiner* — Mohsen Ahmadi
(74) *Attorney, Agent, or Firm* — IP & T Group LLP

(57) ABSTRACT

A method for fabricating a variable resistance memory device in accordance with an embodiment of the present invention includes: sequentially forming a first conductive layer and a variable resistance layer on a substrate; forming stacked structures in which first conductive lines and variable resistance lines are sequentially stacked by selectively etching the variable resistance layer and the first conductive layer; forming an insulating layer to fill a space between the stacked structures; forming a second conductive layer on the insulating layer and the stacked structures; and forming a second conductive line and a variable resistance pattern by etching the second conductive layer and the variable resistance line using mask patterns in a line type extending in a direction intersecting the stacked structures.

13 Claims, 15 Drawing Sheets

METHOD FOR FABRICATING VARIABLE RESISTANCE MEMORY DEVICE

CROSS-REFERENCE TO RELATED APPLICATIONS

The present application claims priority of Korean Patent Application No. 10-2011-0145040, filed on Dec. 28, 2011, which is incorporated herein by reference in its entirety.

BACKGROUND

1. Field

Exemplary embodiments of the present invention relate to a method for fabricating a variable resistance memory device, and more particularly, to a method for fabricating a variable resistance memory device having a cross point cell array structure.

2. Description of the Related Art

A variable resistance memory device is a data storage device that uses characteristics of switching between at least two different resistance states by varying resistance according to external stimuli. Exemplary variable resistance memory devices include a resistive random access memory (ReRAM), a phase change RAM (PCRAM), a spin transfer torque-RAM (STT-RAM), etc.

According to an example, a ReRAM includes a variable resistance layer made of variable resistance materials, such as Perovskite-based materials or transition metal oxides, and electrodes on both sides of the variable resistance layer. Using this structure, a filament current path within the variable resistance layer is formed or removed according to a voltage applied to the electrodes. Here, the variable resistance layer is in a low resistance state when the filament current path is generated and is in a high resistance state when the filament current path is removed. According to an example, switching from the high resistance state to the low resistance state is referred to as a set operation, while switching from the low resistance state to the high resistance state is referred to as a reset operation.

Meanwhile, in order to improve integration of the variable resistance memory device, a so-called cross point cell array structure has been proposed. Hereinafter, a process for fabricating the variable resistance memory device having the cross point cell array structure in accordance with the related art will be described.

FIG. 1 is a circuit diagram of a variable resistance memory device having a cross point cell array structure, and FIG. 2 is a diagram schematically illustrating a structure in which the variable resistance memory device of FIG. 1 forms a stacked, multilayer structure.

Referring to FIG. 1, memory cells (MCs) are disposed at each intersecting point among a plurality of bit lines (BLs) and a plurality of word lines WL intersecting the plurality of bit lines (BLs). In this configuration, each memory cell (MCs) includes variable resistance elements of which the resistance varies according to applied voltages and the like. The structure of the cross point cell array is a stacked, multilayer structure (see FIG. 2) to improve integration of the memory cells (MCs).

FIGS. 3A to 3B are plan views for illustrating a method for fabricating a conventional variable resistance memory device, and FIG. 4 is a cross-sectional view illustrating an arrangement of a memory cell of the conventional variable resistance memory device.

Referring to FIG. 3A, after the plurality of word lines (WLs) extending in one direction are formed, bottom electrodes (BEs) arranged in an island shape are formed on the word lines (WLs) at a designated interval. Subsequently, the variable resistance layers (MCs) are formed on the bottom electrode (BE).

Referring to FIG. 3B, after top electrodes (TEs) are formed on the variable resistance layers (MCs), the plurality of bit lines (BLs) extending in a direction intersecting the word lines (WLs) while contacting the top electrodes (TEs) are formed.

Referring to FIG. 4, the cross point cell array structure may be formed as a multilayer structure by repeatedly performing the fabricating process described above. However, the bottom electrodes (BEs), the memory cells (MCs), and the top electrodes (TEs) are each formed by a separate patterning, where a misalignment between top and bottom layers may occur and cause a sudden increase in contact resistance. In addition, the fabricating process is complicated and the fabricating cost is increased, due to the repetition of the plurality of mask processes.

SUMMARY

An embodiment of the present invention is directed to a method for fabricating a variable resistance memory device capable of preventing defects due to mask pattern misalignment while simplifying a process of fabricating a variable resistance memory device having a cross point cell array structure and reducing fabricating costs.

A method for fabricating a variable resistance memory device in accordance with an embodiment of the present invention includes: sequentially forming a first conductive layer and a variable resistance layer on a substrate; forming stacked structures in which first conductive lines and variable resistance lines are sequentially stacked by selectively etching the variable resistance layer and the first conductive layer; forming an insulating layer to fill a space between the stacked structures; forming a second conductive layer on the insulating layer and the stacked structures; and forming a second conductive layer on the insulating layer and the stacked structure; and forming a second conductive line and a variable resistance pattern by etching the second conductive layer and the variable resistance line using mask patterns in a line type extending in a direction intersecting the stacked structures.

A method for fabricating a variable resistance memory device in accordance with another embodiment of the present invention includes: sequentially forming a first conductive layer for wiring, a first conductive layer for electrode, a variable resistance layer, and a second conductive layer for electrode on a substrate; forming stacked structures in which a first wiring, a first electrode, a variable resistance line, and a second electrode are sequentially stacked by selectively etching the second conductive layer for electrode, the variable resistance layer, the first conductive layer for electrode, and the first conductive layer for wiring; forming an insulating layer to fill a space between the stacked structures; forming the second conductive layer for wiring on the insulating layer and the stacked structures; and forming a second wiring, a second electrode pattern, and a variable resistance pattern by etching the second conductive layer for wiring, the second electrode, and the variable resistance line using a mask pattern, wherein the mask pattern forms lines that extend in a direction crossing a direction that the stacked structures extend.

A method for fabricating a variable resistance memory device in accordance with another embodiment of the present invention includes: sequentially forming a first conductive layer and a variable resistance layer on a substrate; forming first stacked structures in which first conductive lines and first variable resistance lines are sequentially stacked by selectively etching the variable resistance layer and the first conductive layer; forming a first insulating layer to fill a space between the first stacked structures; sequentially forming a second conductive layer and a second variable resistance layer on the first insulating layer and the first stacked structure; forming second stacked structures in which a first variable resistance pattern, a second conductive line, and a second variable resistance line are sequentially stacked by etching the second variable resistance layer, the second conductive layer, and the first variable resistance line using a mask pattern, wherein the mask pattern forms lines that extend in a direction crossing a direction that the stacked structures extend; forming a second insulating layer to fill a space between the second stacked structures; and forming a third conductive layer for wiring on the second insulating layer and the second stacked structure.

DETAILED DESCRIPTION

Hereinafter, exemplary embodiments of the present invention will be described with reference to the accompanying drawings so that a person with an ordinary skilled in the art to which the present invention pertains can easily carry out technical ideas of the present invention.

Figure 1:
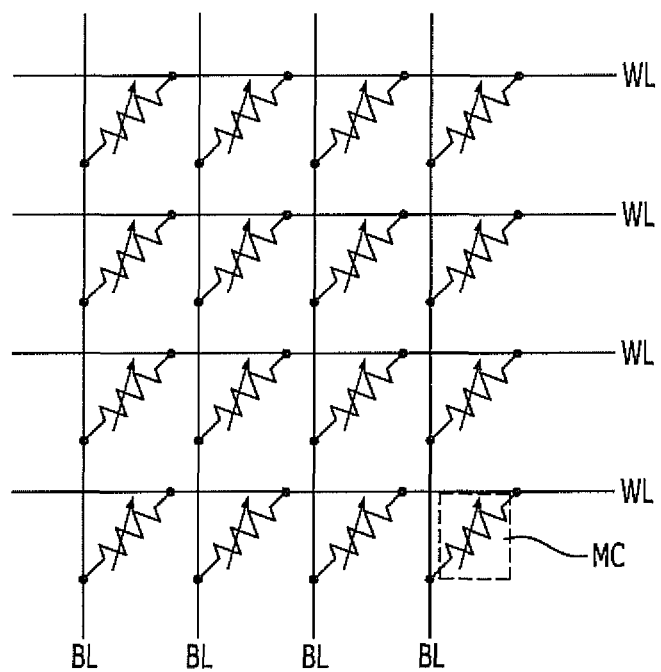
FIG. 1 is a circuit diagram of a variable resistance memory device having a cross point cell array structure.
Figure 2:
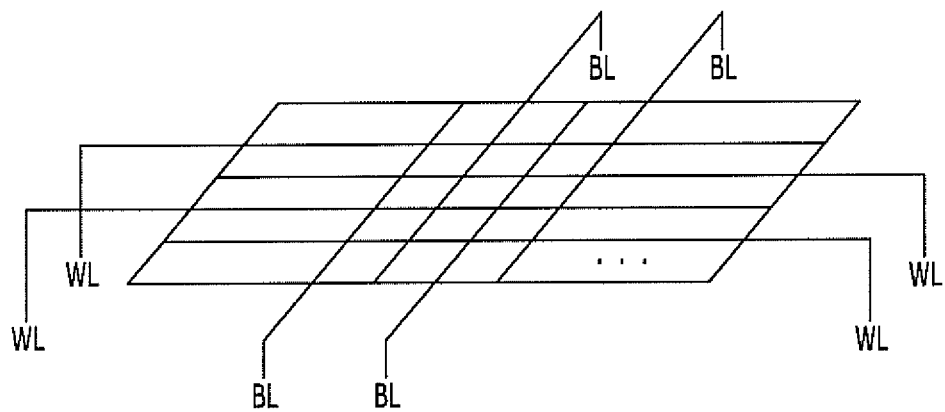
FIG. 2 is a diagram schematically illustrating a structure in which the variable resistance memory device of FIG. 1 forms a stacked, multilayer structure.
Figure 2:
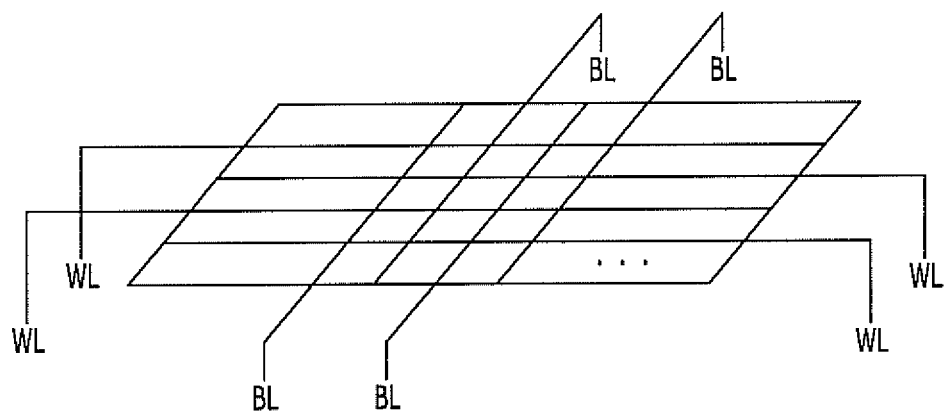
Figure 3A:
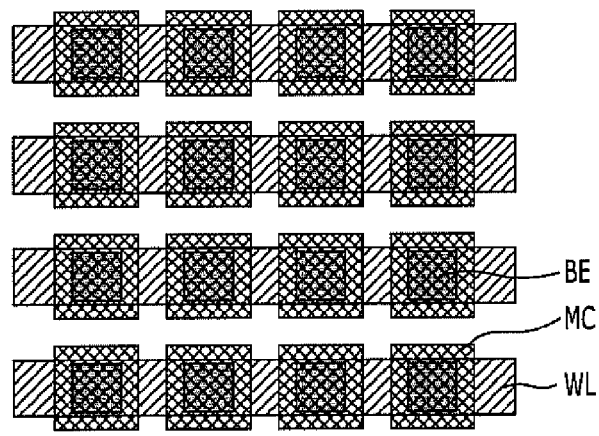
FIGS. 3A to 3B are plan views for illustrating a method for fabricating a conventional variable resistance memory device.
Figure 3B:
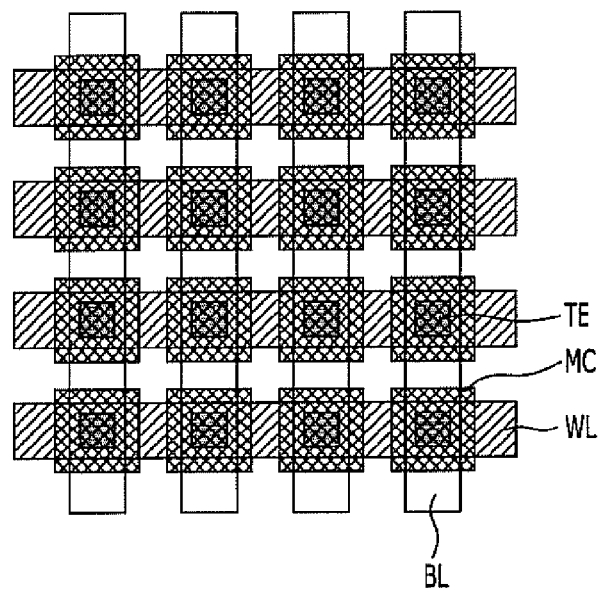
Figure 4:
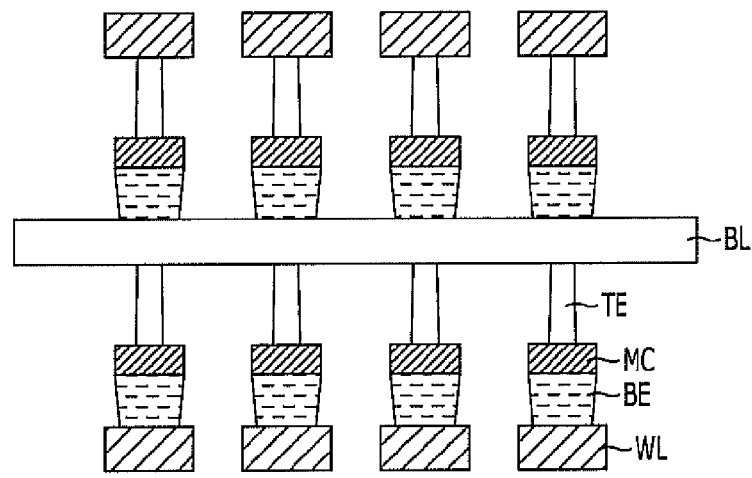
FIG. 4 is a cross-sectional view illustrating an arrangement of memory cells of the conventional variable resistance memory device.
Figure 5:
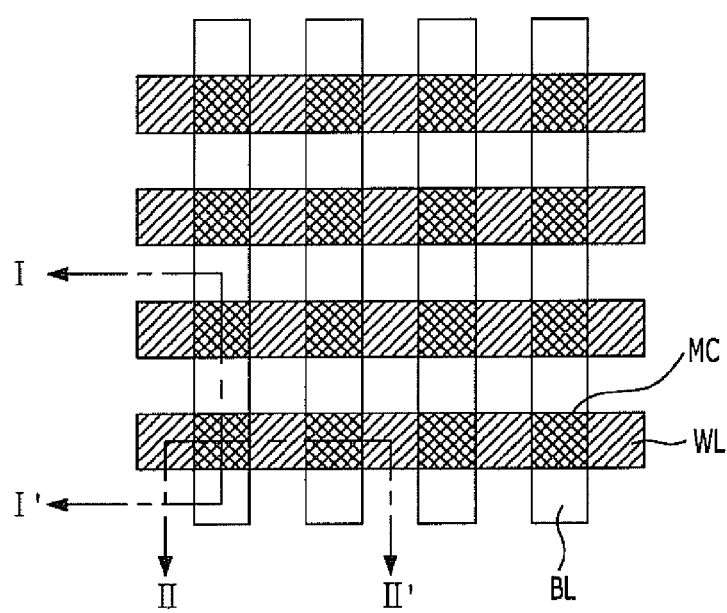
FIG. 5 is a plan view illustrating a layout of a cross point cell array structure.
Figure 6:
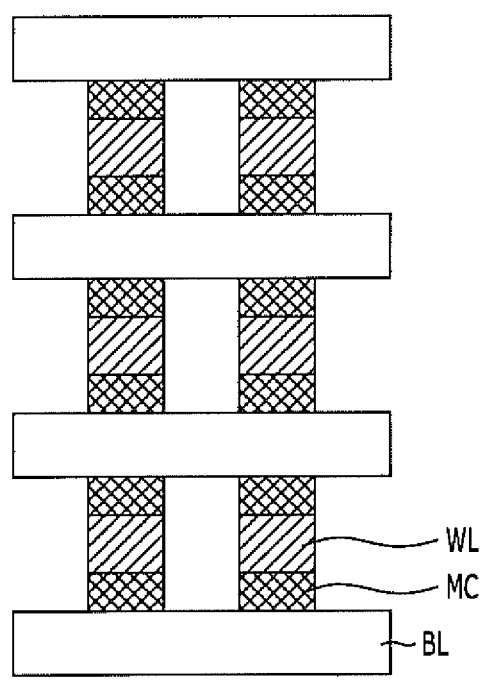
FIG. 6 is a cross-sectional view illustrating an arrangement of memory cells of a variable resistance memory device in accordance with an embodiment of the present invention.

FIG. 5 is a plan view illustrating a layout of a cross point cell array structure, FIG. 6 is a cross-sectional view illustrating an arrangement of memory cells of a variable resistance memory device in accordance with an embodiment of the present invention, and FIGS. 7A to 16B are cross-sectional views for illustrating a method for fabricating a variable resistance memory device in accordance with an embodiment of the present invention. Here, 'A' of each number illustrates a cross section taken along line I-I' of FIG. 5 and 'B' illustrates a cross section taken along line II-II' of FIG. 5.

Figure 7A:
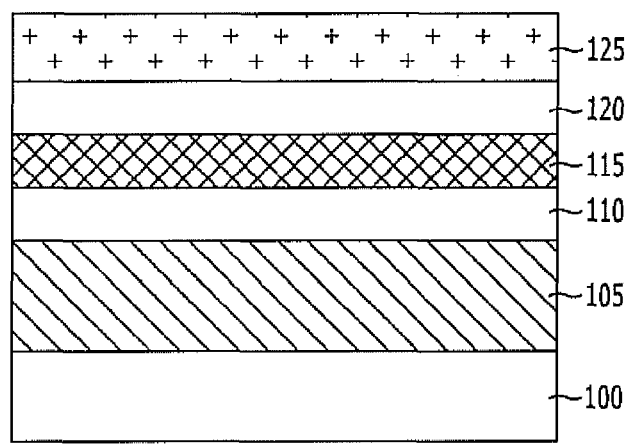
FIGS. 7A to 16B are cross-sectional views for illustrating a method for fabricating a variable resistance memory device in accordance with an embodiment of the present invention.
Figure 7B:
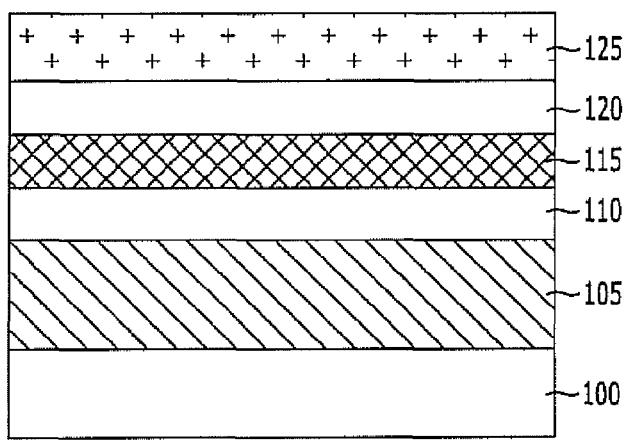

Referring to FIGS. 7A and 7B, a first conductive layer 105 for wiring, a first conductive layer 110 for electrode, a first variable resistance layer 115, a second conductive layer 120 for electrode, and a first hard mask layer 125 are sequentially formed on a substrate 100 having a bottom structure (not illustrated). Meanwhile, although not illustrated in the present cross-sectional views, a selection device layer such as transistors, diodes, and the like may be further formed on a top or bottom portion of the first variable resistance layer 115 and the substrate 100 may include peripheral circuits for driving the variable resistance memory device.

The first conductive layer 105 for wiring, the first conductive layer 110 for electrode, and the second conductive layer 120 for electrode may include conductive materials (for example, metals such as tungsten (W), aluminum (Al), copper (Cu), gold (Au), silver (Ag), platinum (Pt), nickel (Ni), cobalt (Co), chromium (Cr), titanium (Ti), ruthenium (Ru), hafnium (Hf), zirconium (Zr), and the like) or metal nitrides such as titanium nitride (TiN), tantalum nitride (TaN), tungsten nitride (WN), and the like. According to an example, the first conductive layer 105 for wiring may be formed by depositing tungsten W or aluminum (Al) and the first conductive layer 110 for electrode and the second conductive layer 120 for electrode may be formed by depositing titanium nitride (TiN).

The first variable resistance layer 115 may be a structure in which electric resistance is changed due to oxygen vacancy, migration of ions, or a phase change in materials. Alternatively, first variable resistance layer 115 may be a magnetic tunnel junction (MTJ) structure in which electric resistance is changed due to magnetic field or spin transfer torque (STT).

Here, the structure in which the electric resistance is changed due to the oxygen vacancy or the migration of ions may include binary oxides (for example, Perovskite-based materials such as STO($SrTiO_3$), BTO($BaTiO_3$), PCMO($Pr_{1-x}Ca_xMnO_3$), and the like) or transition metal oxide (TMO) such as titanium oxide ($TiO_2$), hafnium oxide ($HfO_2$), zirconium oxide ($ZrO_2$), aluminum oxide ($Al_2O_3$), tantalum oxide ($Ta_2O_5$), niobium oxide ($Nb_2O_5$), cobalt oxide ($Co_3O4$), nickel oxide (NiO), tungsten oxide ($WO_3$), lanthanum oxide ($La_2O_3$), and the like. The structure in which the electric resistance is changed due to the phase change in materials may include a material changed into a crystalline or amorphous state by heat (for example, chalcogenide-based materials such as GST (GeSbTe), and the like, in which antimony and tellurium are coupled with each other at a certain ratio).

As to a magnetic tunnel junction (MTJ) structure, it may include a magnetic free layer, a magnetic fixing layer, and a barrier layer interposed therebetween and the magnetic free layer. A magnetic fixing layer may include ferromagnetic materials (for example, iron (Fe), nickel (Ni), cobalt (Co), gadolinium (Gd), dysprosium, or a compound thereof) and a barrier layer may include magnesium oxide (MgO), aluminum oxide ($Al_2O_3$), hafnium oxide ($HfO_2$), zirconium oxide ($ZrO_2$), silicon oxide ($SiO_2$), and the like.

The first hard mask layer 125 may be formed of bottom anti-reflective coating (BARC), silicon oxynitride (SiON), an amorphous carbon layer (ACL), polysilicon, a silicon nitride layer (SiN), a silicon oxide layer ($SiO_2$), or a stacked structure thereof.

Figure 8A:
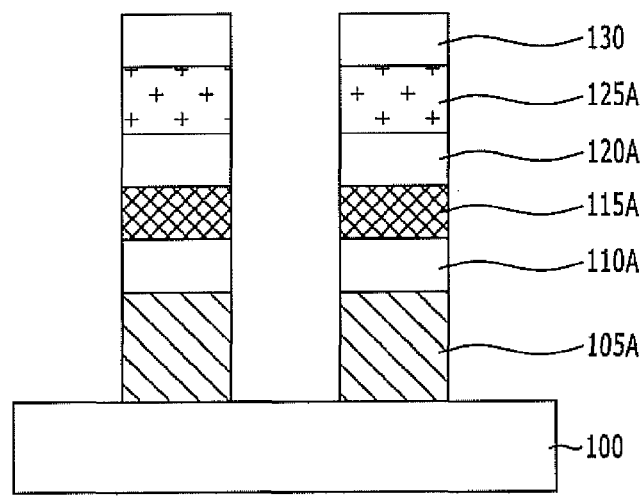
Figure 8B:
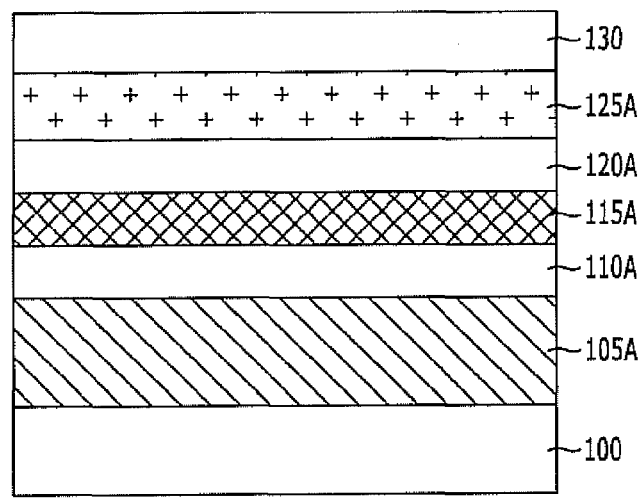

Referring to FIGS. 8A and 8B, a first photoresist pattern 130 in a line type extending in a II-II direction (see FIG. 5) is formed on the first hard mask layer 125 and subsequently, the first hard mask layer 125, the second conductive layer 120 for electrode, the first variable resistance layer 115, the first conductive layer 110 for electrode, and the first conductive layer 105 for wiring are etched by using the first photoresist pattern 130 as an etch mask to form a first hard mask pattern 125A, a second electrode 120A, a first variable resistance line 115A, a first electrode 110A, and a first wiring 105A. The first wiring 105A may be bit lines (see BLs of FIG. 6) or word lines (see WLs of FIG. 6).

Here, the etching process may be performed by a reactive ion etching (RIF) scheme, and the first photoresist pattern 130 may be removed during the etching process. Hereinafter, for illustration purposes, the structure in which the first wiring 105A, the first electrode 110A, the first variable resistance line 115A, the second electrode 120A, and the first hard mask pattern 125A are sequentially stacked are referred to as a first stacked structure. The plurality of first stacked structures may be arranged in parallel.

Figure 9A:
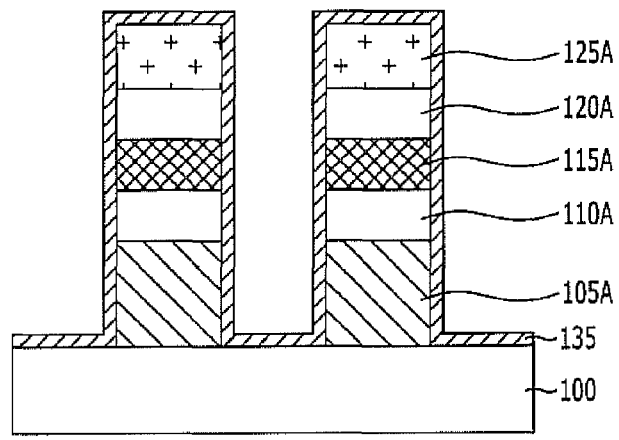
Figure 9B:
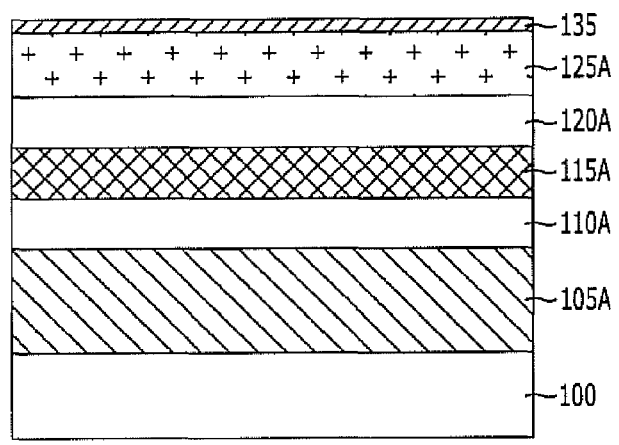

Referring to FIGS. 9A and 9B, first spacer layers 135 are formed on front surfaces of the first stacked structures. The first spacer layers 135, which prevent oxidization of the second electrode 120A, the first electrode 110A, and the first wiring 105A and prevent a change in characteristics of the first variable resistance line 115A, may be formed by conformally depositing nitride-based materials on the substrate 100 on which the first stacked structures are formed. According to an example, the first spacer layers 135 are subjected to a blanket etch so as to remain, for example, only on side walls of the first stacked structures.

Figure 10A:
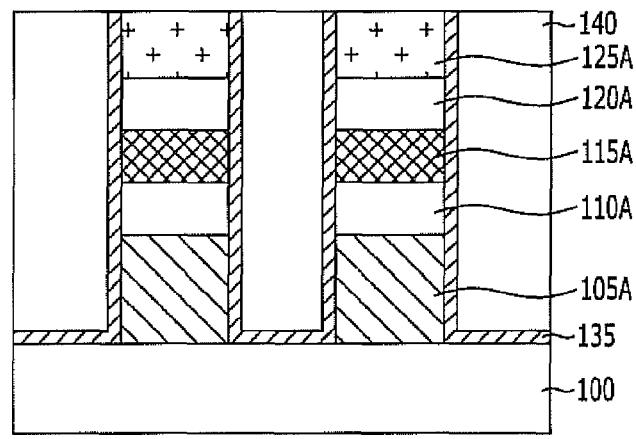
Figure 10B:
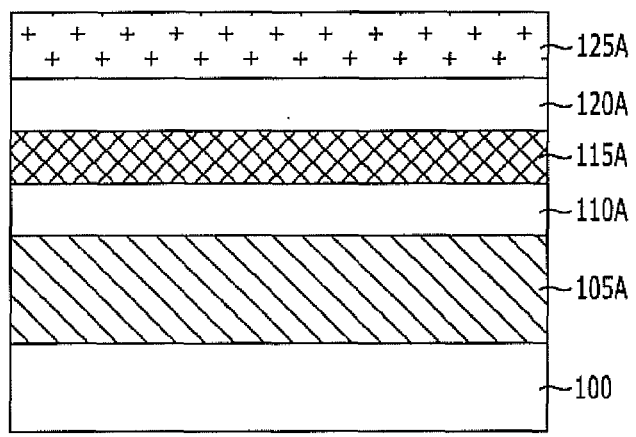

Referring to FIGS. 10A and 10B, first insulating layers 140 burying a space between the first stacked structures are formed. The first insulating layer 140 may be formed by a process of depositing any one of oxide-based materials (for example, tetra ethyl ortho silicate (TEOS), boron phosphorus silicate glass (BPSG), boron silicate glass (BSG), phosphorus silicate glass (PSG), fluorinated silicate glass (FSG), spin on glass (SOG), and silicon oxide layer ($SiO_2$)) at a thickness sufficient enough to bury a space among the first stacked structures. Subsequently, a planarization process such as chemical mechanical polishing (CMP) until a top surface of the first hard mask pattern 125A is exposed. In this case, a separate process of removing the first hard mask pattern 125A may be omitted by performing the planarization process until the top surface of the second electrode 120A is exposed.

Figure 11A:
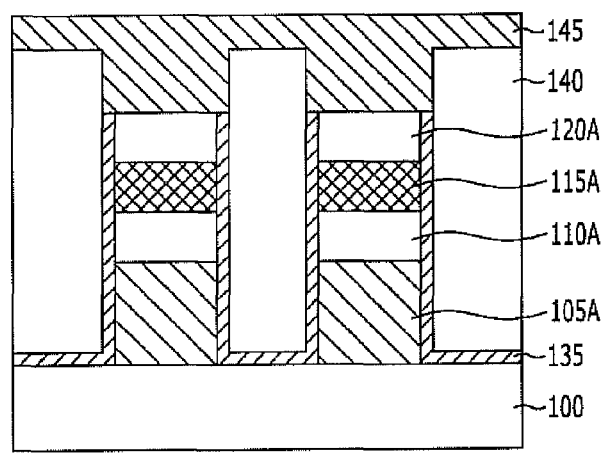
Figure 11B:
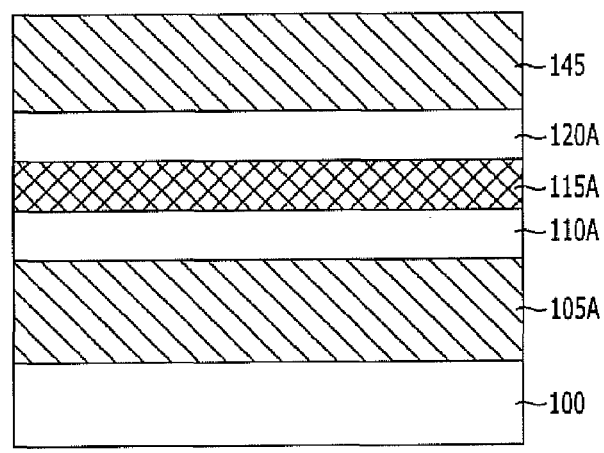

Referring to FIGS. 11A and 11B, after the first hard mask pattern 125A is removed, a second conductive layer 145 for wiring is formed on a resulting structure in which the second electrode 120A is exposed. In this case, in order to remove the first hard mask pattern 125A, a dry etching process using etching equipment of an inductively coupled plasma (ICP) scheme or a capacitively coupled plasma (CCP) scheme or a wet etching process of a dip-out scheme may be performed. The first space layer 135 on the side wall of the first hard mask pattern 125A may be removed during the process.

The second conductive layer 145 for wiring may include conductive materials such as metals (for example, tungsten, aluminum, copper, gold, silver, platinum, nickel, cobalt, chromium, titanium, ruthenium, hafnium, zirconium, and the like) and metal nitrides (e.g., titanium nitride, tantalum nitride, tungsten nitride, and the like). According to an example, the second conductive layer 145 for wiring may be formed by firstly forming a barrier metal of metal nitride and subsequently depositing tungsten or aluminum.

Figure 12A:
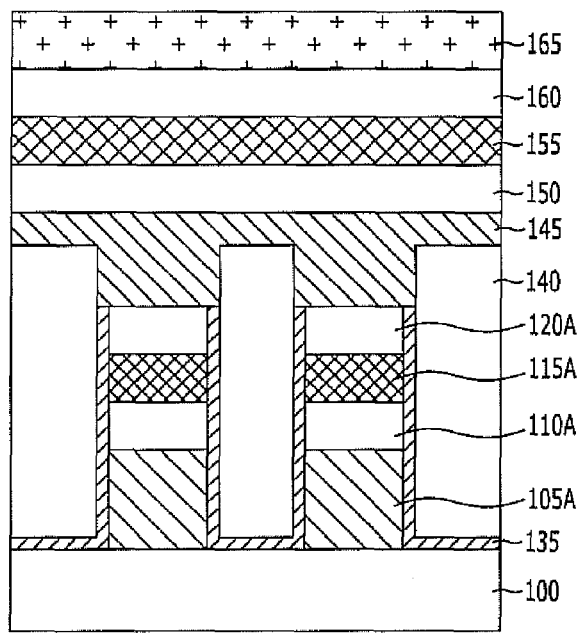
Figure 12B:
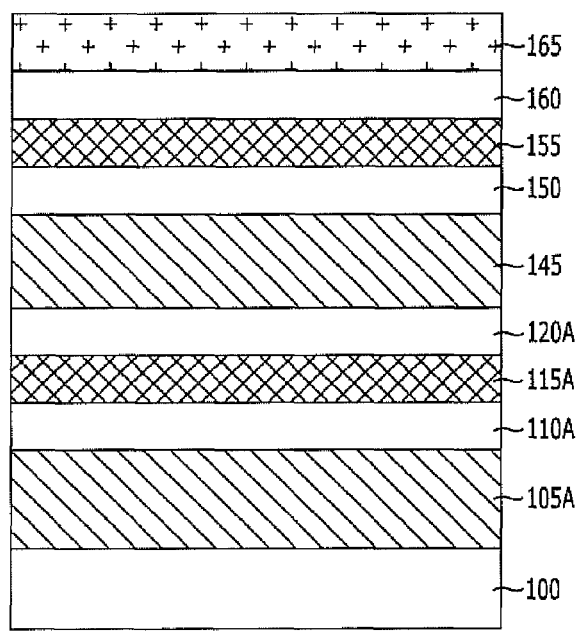

Referring to FIGS. 12A and 12B, a third conductive layer 150 for electrode, a second variable resistance layer 155, a fourth conductive layer 160 for electrode, and a second hard mask layer 165 are sequentially formed on the second conductive layer 145 for wiring. In this case, although not illustrated in the cross-sectional views, a selection device layer such as transistors, diodes, and the like may be further formed on a top or bottom portion of the second variable resistance layer 155.

The third conductive layer 150 for electrode and the fourth conductive layer 160 for electrode may include conductive materials such as metals (for example, tungsten, aluminum, copper, gold, silver, platinum, nickel, cobalt, chromium, titanium, ruthenium, hafnium, zirconium, and the like) and metal nitrides (for example, titanium nitride, tantalum nitride, tungsten nitride, and the like). According to an example, the third conductive layer 150 for electrode and the fourth conductive layer 160 for electrode may be formed by depositing titanium nitride.

The second variable resistance layer 155 may be a structure in which electric resistance is changed due to oxygen vacancy, migration of ions, or a phase change in materials and may also be a magnetic tunnel junction (MTJ) structure in which electric resistance is changed due to magnetic field or spin transfer torque (STT). Here, an MTJ structure may be formed of any reasonably suitable material such as the first variable resistance layer 115 and the like.

The second hard mask layer 165 may be formed of bottom anti-reflective coating (BARC), silicon oxynitride (SiON), an amorphous carbon layer (ACL), polysilicon, a silicon nitride layer (SiN), a silicon oxide layer ($SiO_2$), or a combination thereof.

Figure 13A:
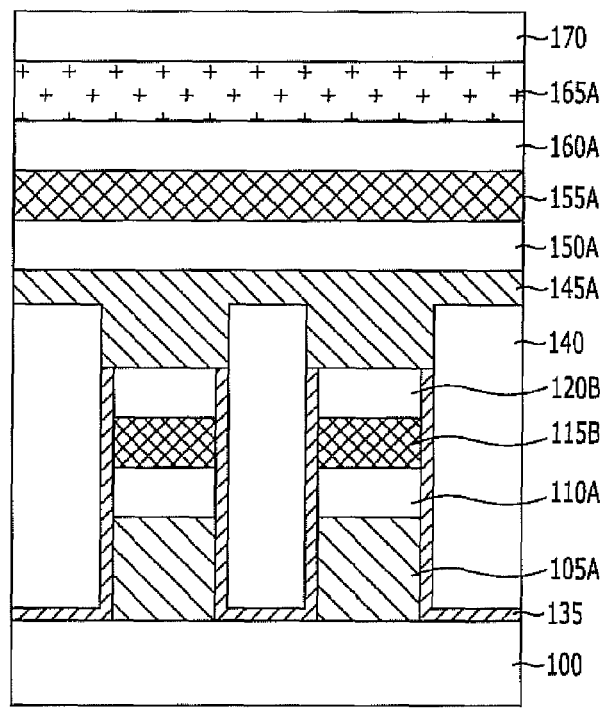
Figure 13B:
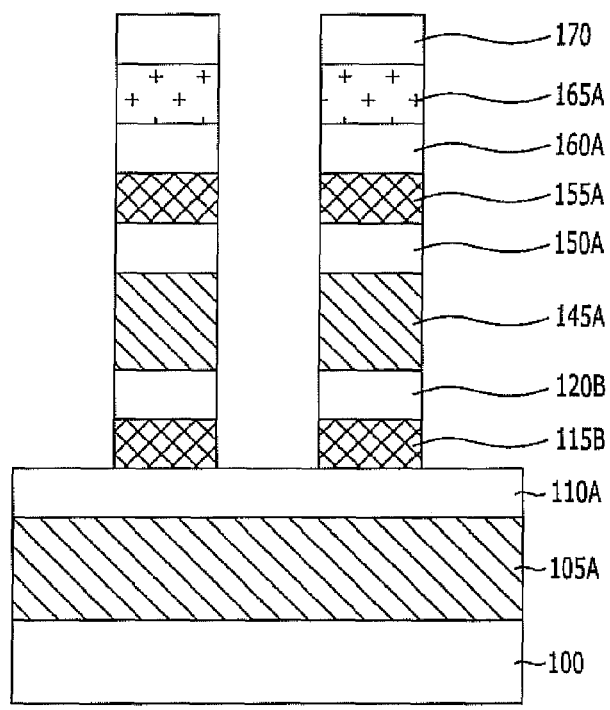

Referring to FIGS. 13A and 13B, a second photoresist pattern 170 forming lines extending in I-I' direction (see FIG. 5) is formed on the second hard mask layer 165 and subsequently, the second hard mask layer 165, the fourth conductive layer 160 for electrode, the second variable resistance layer 155, the third conductive layer 150 for electrode, the second conductive layer 145 for wiring, the second electrode 120A, and the first variable resistance line 115A are etched by using the second photoresist pattern 170 as an etch mask to form a second hard mask pattern 165A, a fourth electrode 160A, a second variable resistance line 155A, a third electrode 150A, a second wiring 145A, a second electrode pattern 120B, and a first variable resistance pattern 115B. The second wiring 145A may be word lines (see WLs of FIG. 6) or bit lines (see BLs of FIG. 6) and the second electrode pattern 120B and the first variable resistance pattern 115B may have an island shape arranged in a matrix form when viewed from the top.

Here, the etching process may be performed using a reactive ion etching (RIE) scheme, where the first electrode 110A and the first wiring 105A may be partially etched during the etch process and the second photoresist pattern 170 may be removed. Hereinafter, for illustration purposes, the structure in which the first variable resistance pattern 115B, the second electrode pattern 120B, the second wiring 145A, the third electrode 150A, the second variable resistance line 155A, the fourth electrode 160A, and the second hard mask pattern 165A are sequentially stacked is referred to as the second stacked structure. The plurality of second stacked structures may be arranged in parallel.

Figure 14A:
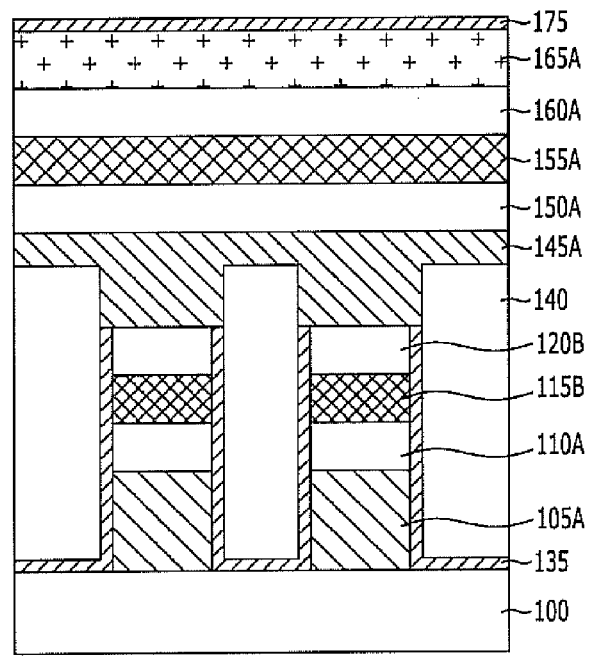
Figure 14B:
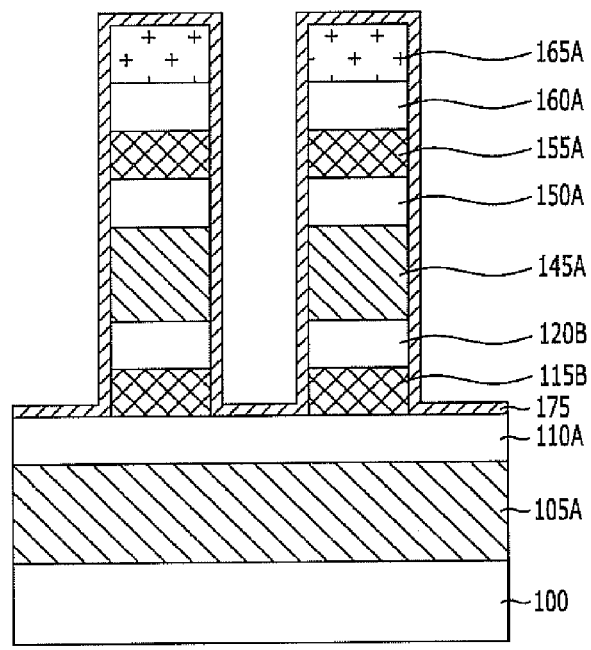

Referring to FIGS. 14A and 14B, the second spacer layers 175 are formed on front surfaces of the second stacked structures. The second spacer layer 175, which is to prevent oxidization of the fourth electrode 160A, the third electrode 150A, the second wiring 145A, and the second electrode pattern 120B and prevent a change in characteristics of the second variable resistance line 155A and the first variable resistance pattern 115B, may be formed by conformally depositing nitride-based materials on the first electrode 110A on which the second stacked structure is formed. According to an example, the second spacer layers 175 are subjected to a blanket etch so as to remain, for example, only on a side wall of the first stacked structure.

Figure 15A:
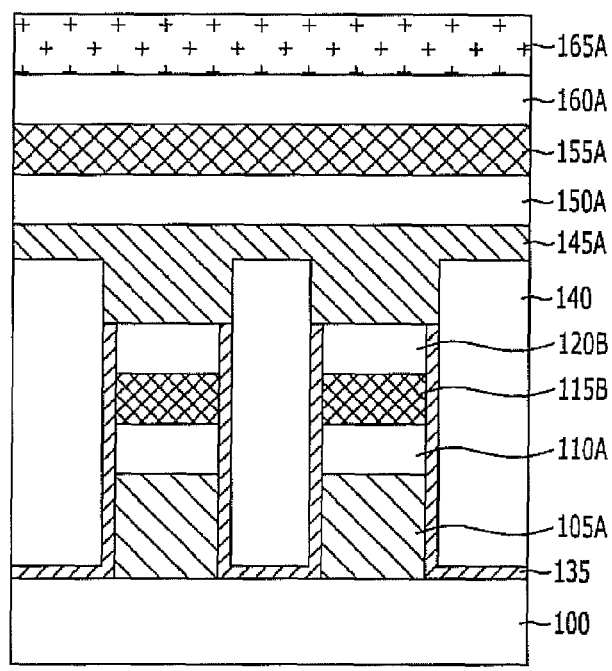
Figure 15B:
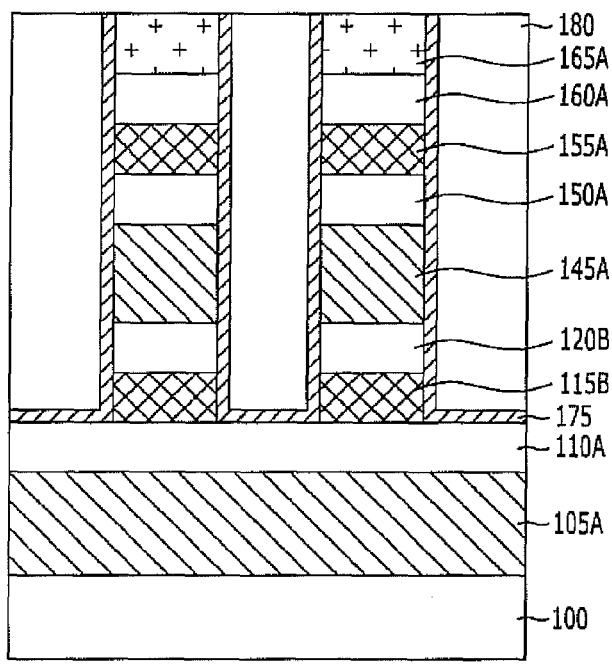

Referring to FIGS. 15A and 15B, second insulating layers 180 burying a space between the second stacked structures are formed. The second insulating layer 180 may be formed by a process of depositing any one of oxide-based materials (for example, TEOS, BPSG, BSG, PSG, FSG, SOG, and silicon oxide layer) at a thickness sufficient enough to bury a space among the second stacked structures. Subsequently, a planarization process such as chemical mechanical polishing (CMP), and the like, until a top surface of the second hard mask pattern 165A is exposed. In this case, a separate process of removing the second hard mask pattern 165A may be omitted by performing the planarization process until the top surface of the fourth electrode 160A is exposed.

Figure 16A:
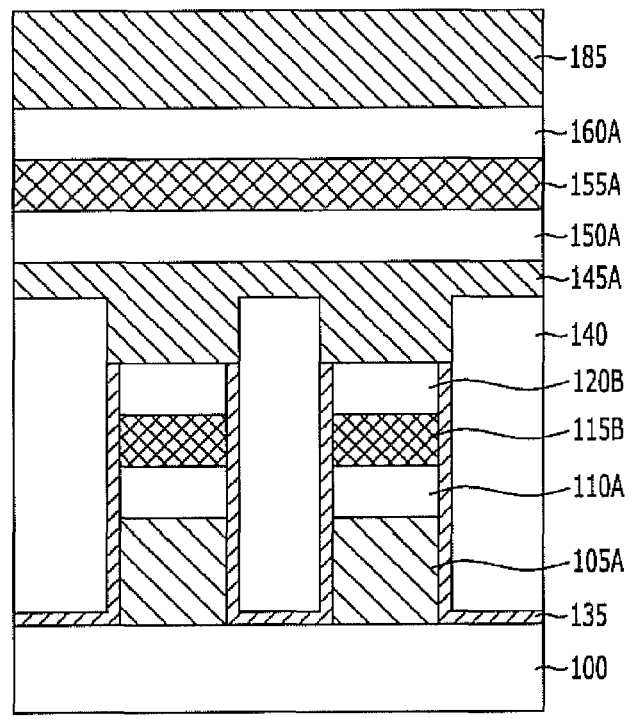
Figure 16B:
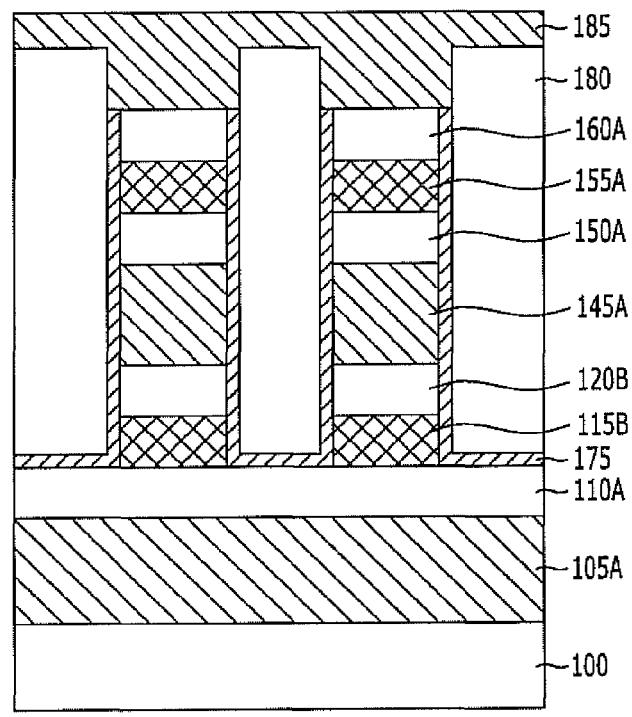

Referring to FIGS. 16A and 16B, after the second hard mask pattern 165A is removed, the third conductive layer 185 for wiring is formed on a resulting structure in which the fourth electrode 160A is exposed. In this case, in order to remove the second hard mask pattern 165A, a dry etching process using etching equipment of an inductively coupled plasma (ICP) scheme or a capacitively coupled plasma (CCP) scheme or a wet etching process of a dip-out scheme may be performed. The second space layers 175 on the side wall of the second hard mask pattern 165A may be removed during the process.

The third conductive layer 185 for wiring may include conductive materials such as metals (for example, tungsten, aluminum, copper, gold, silver, platinum, nickel, cobalt, chromium, titanium, ruthenium, hafnium, zirconium, and the like) and metal nitrides (e.g., titanium nitride, tantalum nitride, tungsten nitride, and the like). According to an example, the third conductive layer 185 for wiring may be formed by firstly forming a barrier metal of metal nitride and subsequently depositing tungsten or aluminum.

Referring to FIGS. 5 and 6 again, the cross point cell array structure may be formed as a multilayer structure by repeatedly performing the fabricating process described above. The cross point cell array structure is a structure in which the memory cells (MCs) are arranged at intersecting points between the plurality of parallel bit lines (BLs) and the plurality of parallel word lines (WLs) while intersecting the bit lines (BLs), wherein the selection device (not illustrated), for example, transistors or diodes, and the like, may be connected to the top or bottom portion of each memory cell (MCs).

Here, the memory cells (MCs) may include the variable resistance pattern having an island shape and the electrode (not illustrated) may be further interposed between each memory cell (MCs) and the bit lines (BLs) and the word lines (WLs). While FIG. 6 illustrates a shape in which the memory cells (MCs) are stacked in six layers, the present invention is not limited thereto, and the memory cells (MC) may be stacked in five layers or less or seven layers or more.

As described above, the method for fabricating a variable resistance memory device in accordance with an embodiment of the present invention may be implemented by the process of patterning the bit lines or the word lines at the same time that the wirings are patterned instead of performing a patterning process by using the variable resistance pattern and separate mask patterns for the electrodes on the top and bottom portions of the variable resistance patterns. Therefore, the embodiments of the present invention may prevent an increase in contact resistance due to the misalignment of the mask pattern and simplify the fabricating process by reducing the mask process to thus reduce fabrication costs.

The method for fabricating a variable resistance memory device in accordance with the embodiments of the present invention may prevent defects due to the mask pattern misalignment while simplifying the process of fabricating a variable resistance memory device having the cross point cell array structure and reducing the fabricating cost.

While the present invention has been described with respect to the specific embodiments, it will be apparent to those skilled in the art that various changes and modifications may be made without departing from the spirit and scope of the invention as defined in the following claims.

What is claimed is:

1. A method for fabricating a variable resistance memory device, comprising:
   sequentially forming a first conductive layer and a variable resistance layer on a substrate;
   forming stacked structures in which first conductive lines and variable resistance lines are sequentially stacked by selectively etching the variable resistance layer and the first conductive layer;
   forming an insulating layer to fill a space between the stacked structures;
   forming a second conductive layer on the insulating layer and the stacked structures; and
   forming a second conductive line and a variable resistance pattern by etching the second conductive layer and the variable resistance line using a mask pattern, wherein the mask pattern forms lines that extend in a direction crossing a direction that the stacked structures extend.

2. The method of claim 1, further comprising: forming spacer layers on side walls of the stacked structures after the forming of the stacked structures.

3. The method of claim 1, wherein the variable resistance layer includes a structure in which electric resistance is changed due to oxygen vacancy, migration of ions, or a phase change in materials or a magnetic tunnel junction structure in which electric resistance is changed due to magnetic field or spin transfer torque.

4. The method of claim 1, further comprising: forming a selection device layer on a top or bottom portion of the variable resistance layer.

5. A method for fabricating a variable resistance memory device, comprising:
   sequentially forming a first conductive layer for wiring, a first conductive layer for electrode, a variable resistance layer, and a second conductive layer for electrode on a substrate;
   forming stacked structures in which a first wiring, a first electrode, a variable resistance line, and a second electrode are sequentially stacked by selectively etching the second conductive layer for electrode, the variable resistance layer, the first conductive layer for electrode, and the first conductive layer for wiring;
   forming an insulating layer to fill a space between the stacked structures;
   forming the second conductive layer for wiring on the insulating layer and the stacked structures; and
   forming a second wiring, a second electrode pattern, and a variable resistance pattern by etching the second conductive layer for wiring, the second electrode, and the variable resistance line using a mask pattern, wherein the mask pattern forms lines that extend in a direction crossing a direction that the stacked structures extend.

6. The method of claim 5, further comprising: forming spacer layers on side walls of the stacked structures after the forming of the stacked structures.

7. The method of claim 5, wherein the variable resistance layer includes a structure in which electric resistance is changed due to oxygen vacancy, migration of ions, or a phase change in materials or a magnetic tunnel junction structure in which electric resistance is changed due to magnetic field or spin transfer torque.

8. The method of claim 5, further comprising: forming a selection device layer on a top or bottom portion of the variable resistance layer.

9. A method for fabricating a variable resistance memory device, comprising:
  sequentially forming a first conductive layer and a first variable resistance layer on a substrate;
  forming first stacked structures in which first conductive lines and first variable resistance lines are sequentially stacked by selectively etching the first variable resistance layer and the first conductive layer;
  forming a first insulating layer to fill a space between the first stacked structures;
  sequentially forming a second conductive layer and a second variable resistance layer on the first insulating layer and the first stacked structure;
  forming second stacked structures in which a first variable resistance pattern, a second conductive line, and a second variable resistance line are sequentially stacked by etching the second variable resistance layer, the second conductive layer, and the first variable resistance line using a mask pattern, wherein the mask pattern forms lines that extend in a direction crossing a direction that the first stacked structures extend;
  forming a second insulating layer to fill a space between the second stacked structures; and
  forming a third conductive layer on the second insulating layer and the second stacked structure.

10. The method of claim 9, further comprising: forming spacer layers on side walls of the first or second stacked structures after the forming of the first or second stacked structures.

11. The method of claim 9, wherein the first and second variable resistance layers include a structure in which electric resistance is changed due to oxygen vacancy, migration of ions, or a phase change in materials or a magnetic tunnel junction structure in which electric resistance is changed due to magnetic field or spin transfer torque.

12. The method of claim 9, further comprising: forming a selection device layer on a top or bottom portion of the first or second variable resistance layer.

13. The method of claim 9, further comprising:
  forming a third variable resistance layer on the third conductive layer; and
  forming third stacked structures in which a second variable resistance pattern, a third conductive line, and a third variable resistance line are sequentially stacked by etching the third variable resistance layer, the third conductive layer, and the second variable resistance line using a mask pattern, wherein the mask pattern forms lines that extend in a direction crossing a direction that the second stacked structures extend.

* * * * *